(12) United States Patent
Wellmann et al.

(10) Patent No.: US 8,466,453 B2
(45) Date of Patent: Jun. 18, 2013

(54) ORGANIC ELECTROLUMINESCENT COMPONENT

(75) Inventors: Philipp Wellmann, Darmstadt (DE); Tobias Canzler, Dresden (DE)

(73) Assignee: Novaled AG, Dresden (DE)

( * ) Notice: Subject to any disclaimer, the term of this patent is extended or adjusted under 35 U.S.C. 154(b) by 366 days.

(21) Appl. No.: 12/738,003

(22) PCT Filed: Oct. 14, 2008

(86) PCT No.: PCT/EP2008/008683
§ 371 (c)(1),
(2), (4) Date: Jul. 13, 2010

(87) PCT Pub. No.: WO2009/049861
PCT Pub. Date: Apr. 23, 2009

(65) Prior Publication Data
US 2012/0187859 A1 Jul. 26, 2012

(30) Foreign Application Priority Data
Oct. 15, 2007 (EP) .................................... 07020153

(51) Int. Cl.
*H01L 51/00* (2006.01)
*H01L 51/05* (2006.01)
*B82Y 10/00* (2006.01)

(52) U.S. Cl.
CPC ........ *H01L 51/0545* (2013.01); *H01L 51/0036* (2013.01); *B82Y 10/00* (2013.01)
USPC ............... 257/40; 257/E51.001; 257/E51.018

(58) Field of Classification Search
CPC ... H01L 51/0545; H01L 51/0036; B82Y 10/00
USPC .............. 257/40, E51.001, E51.018, E51.022
See application file for complete search history.

(56) References Cited

U.S. PATENT DOCUMENTS

| 7,830,089 B2 | 11/2010 | Murano et al. |
| 8,035,297 B2 | 10/2011 | Arakane et al. |

(Continued)

FOREIGN PATENT DOCUMENTS

| EP | 1 388 903 A2 | 2/2004 |
| JP | 2003264085 A | 9/2003 |

(Continued)

OTHER PUBLICATIONS

Terai et al., "Electric-field-assisted bipolar charge generation from internal charge separation zone composed of doped organic bilayer", 2007, Applied Physics Letter, vol. 90, pp. 083502-1-083502-3, Feb. 21, 2007.*

(Continued)

*Primary Examiner* — Nikolay Yushin
(74) *Attorney, Agent, or Firm* — Sutherland Asbill & Brennan LLP

(57) ABSTRACT

The invention relates to an organic electronic luminescent component with an arrangement of organic layers formed between an electrode and a counter electrode, wherein said arrangement of organic layers is electrically insulated from the electrode and the counter electrode and comprises a light-emitting layer and a charge carrier generation region allocated to the light-emitting layer, wherein the charge carrier generation region is configured to provide positive and negative charge carriers at an application of an electrical AC voltage to the electrode and the counter electrode and wherein a pn-layer transition is formed in the charge carrier generation region by means of a p-doped organic layer and a n-doped organic layer arranged next to the p-doped organic layer.

20 Claims, 13 Drawing Sheets

U.S. PATENT DOCUMENTS

2004/0027059 A1* 2/2004 Tsutsui .................. 313/504
2005/0156197 A1 7/2005 Tsutsui et al.
2009/0091011 A1 4/2009 Das et al.

FOREIGN PATENT DOCUMENTS

| JP | 2004095546 A | 3/2004 |
|---|---|---|
| WO | 2007/071450 A1 | 6/2007 |
| WO | 2007/083918 A1 | 7/2007 |

OTHER PUBLICATIONS

Canzler, T., "Highly Power Efficient Organic Light-Emitting Devices Enabled by Phosphorescent and p-i-n Technologies", Organic Light Emitting Materials and Devices, vol. 6333, 633311, 2006.

Kanno, H., "White Stacked Electrophosphorescent Organic Light-Emitting Deices Employing MoO3 as a Charge-Generation Layer", Advanced Materials, pp. 339-342, 2006.

Liao, L. S., "High-Efficiency Tandem Organic Light-Emitting Diodes", Allied Physics Letters, vol. 82, No. 2, pp. 167-169, Jan. 12, 2004.

Matsumoto, T., "27.5L: Late-News Paper: Multiphoton Organic EL Device Having Charge General Layer", SID 03 Digest, pp. 979-981, 2003.

Sun, J. X., "Effective Intermediate Layers for Highly Efficient Stacked Organic Light-Emitting Devices", Applied Physics Letters 87, 2005.

Tang et al., "Organic Electroluminescent Diodes," Appl. Phys. Lett., 1987, 913-915, vol. 51, Issue 12.

Terai et al., "Electric-Field-Assisted Bipolar Charge Generation from Internal Charge Separation Zone Composed of Doped Organic Bilayer," Applied Physics Letters, 2007, 083502-1-083502-3, vol. 90.

Tsutsui et al., "Charge Recombination Electroluminescence in Organic Thin-Film Devices without Charge Injection from External Electrodes," Applied Physics Letters, 2004, 2382-2384, vol. 85, No. 12.

PCT International Search Report for PCT Application No. PCT/EP2008/008683 mailed Jan. 21, 2009.

Canzler et al., "Highly Power Efficient Organic Light-Emitting Devices Enabled by Phosphorescent and p-i-n Technologies," Proc. of SPIE, 2006, 633311-1 through 6333111-8, vol. 6333.

Kleeman et al., "Organic Zener Diodes: Tunneling Across the Gap in Organic Semiconductor Materials," American Chemical Society, 2010, 4929-4934, vol. 10.

Japanese Office Action for JP 2010-529281 mailed Jul. 24, 2012 (9 pages) (English translation).

* cited by examiner

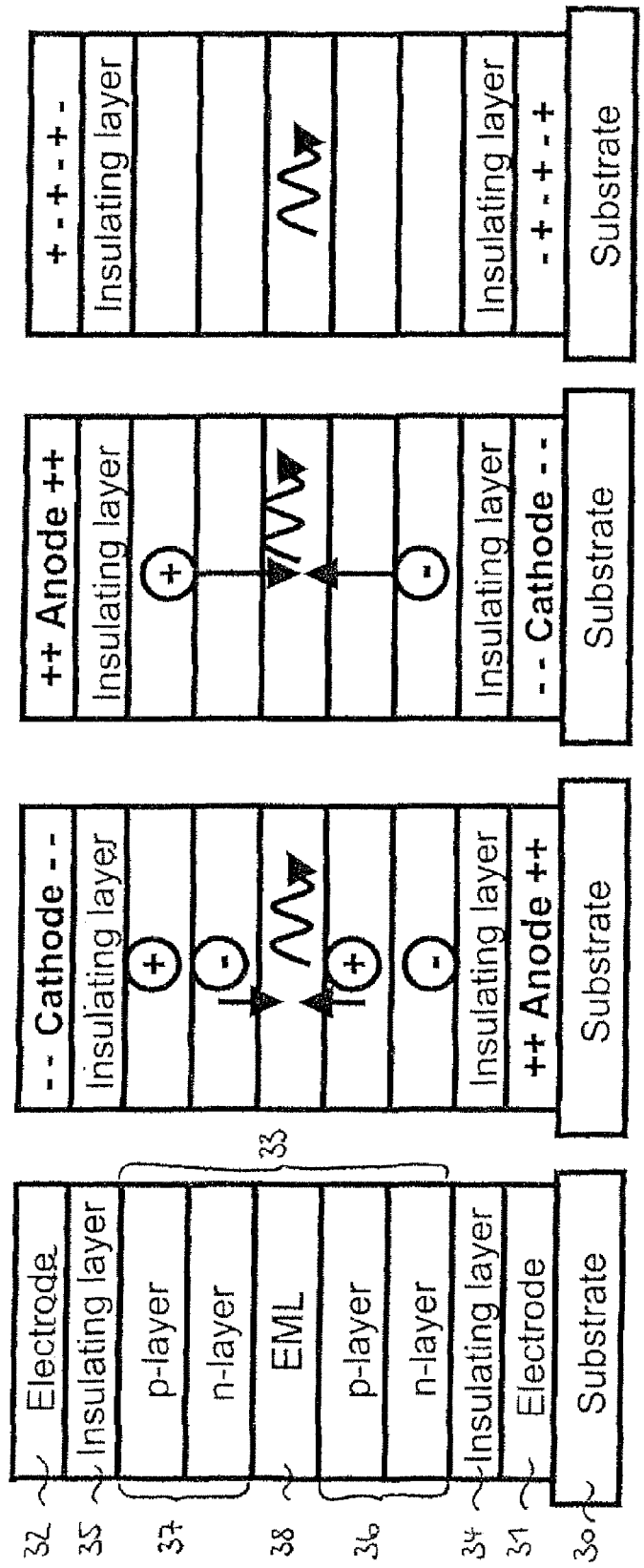

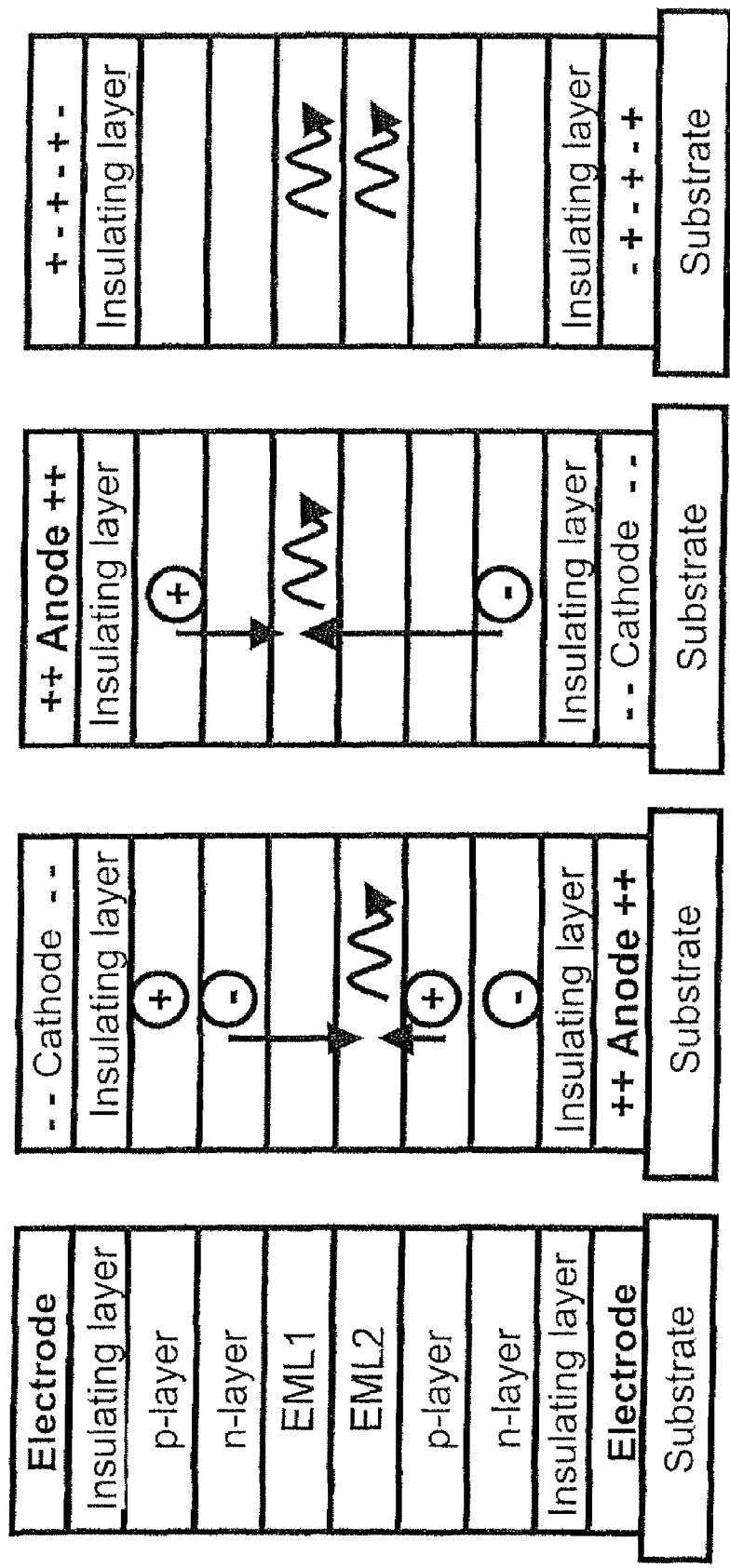

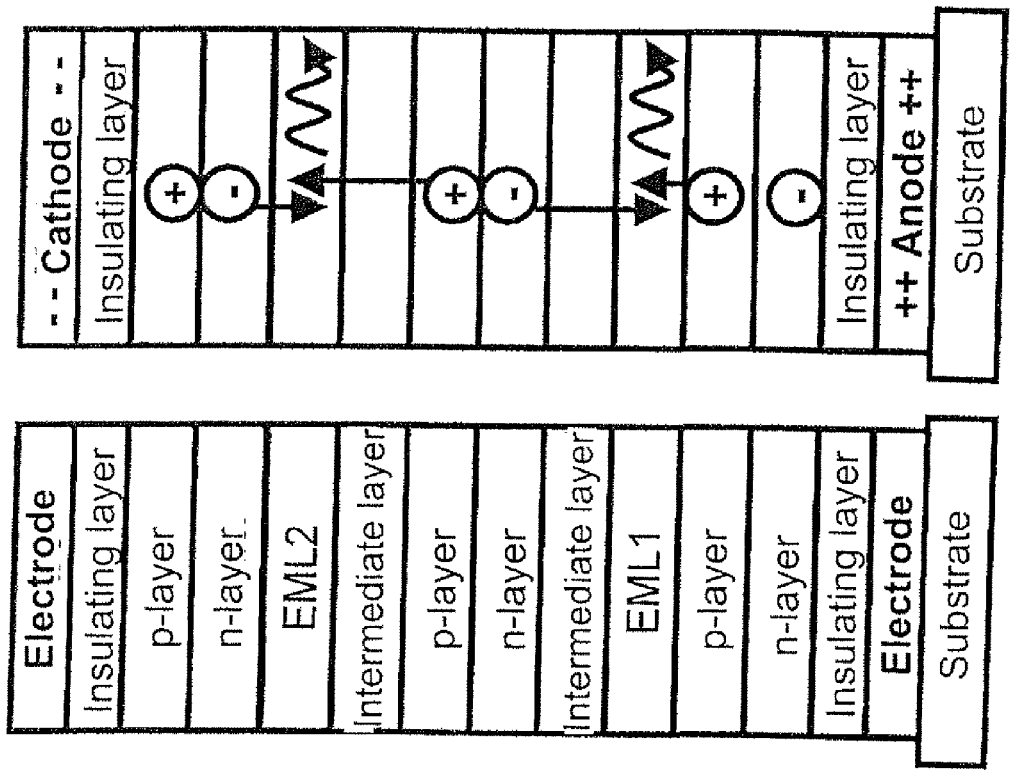
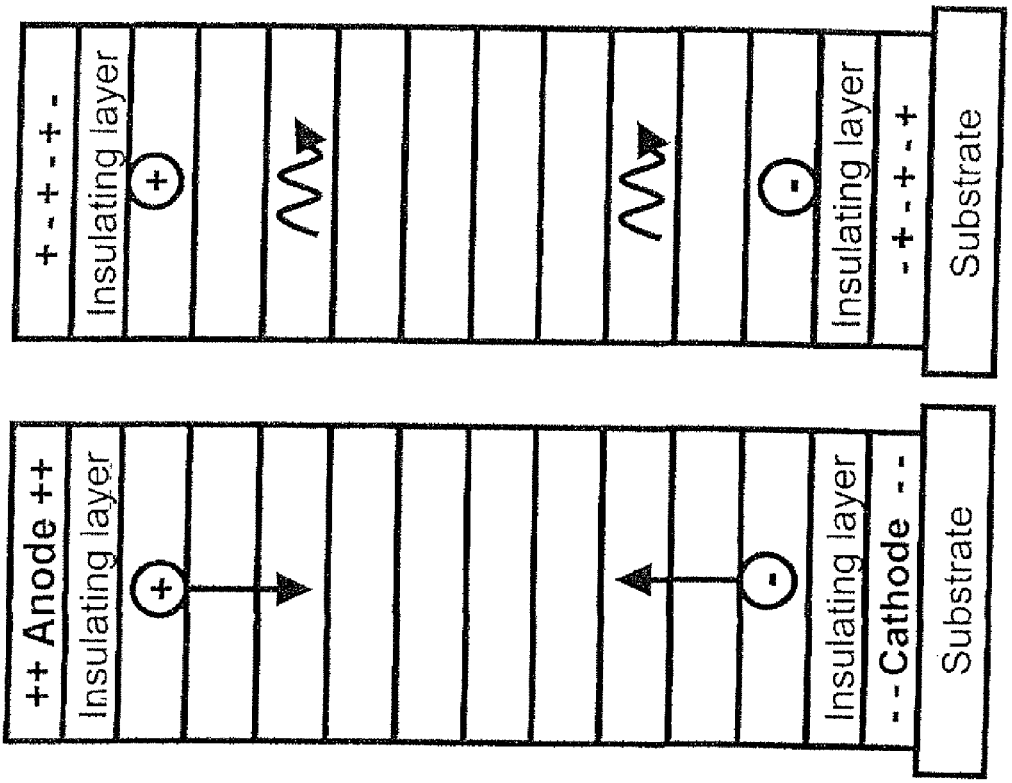
Fig. 5D
Fig. 5C
Fig. 5B
Fig. 5A

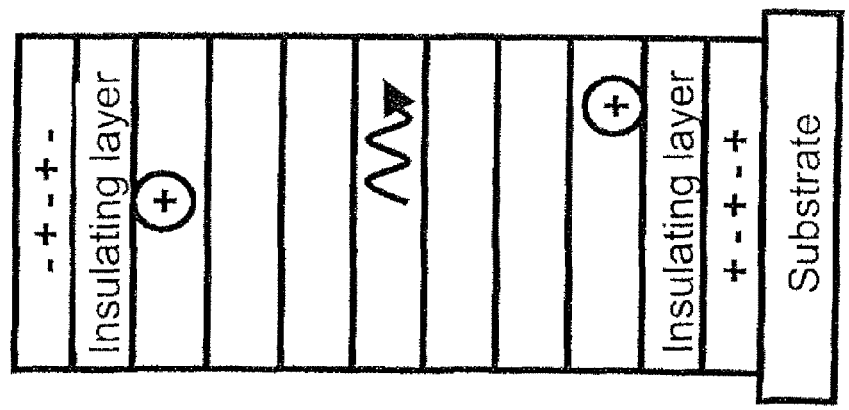
Fig. 6D
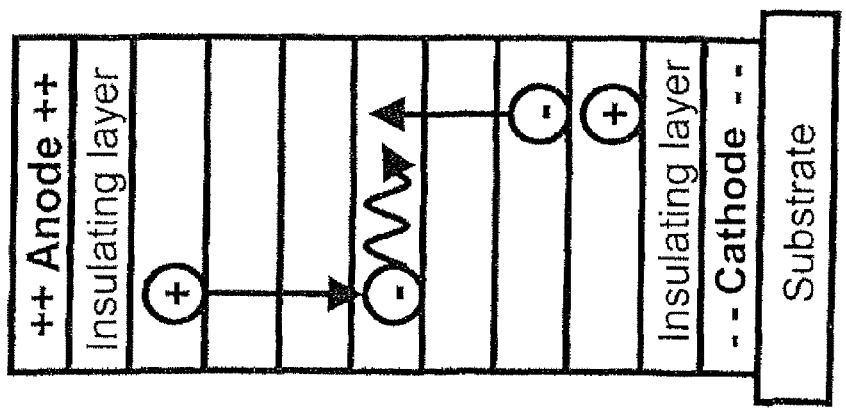
Fig. 6C
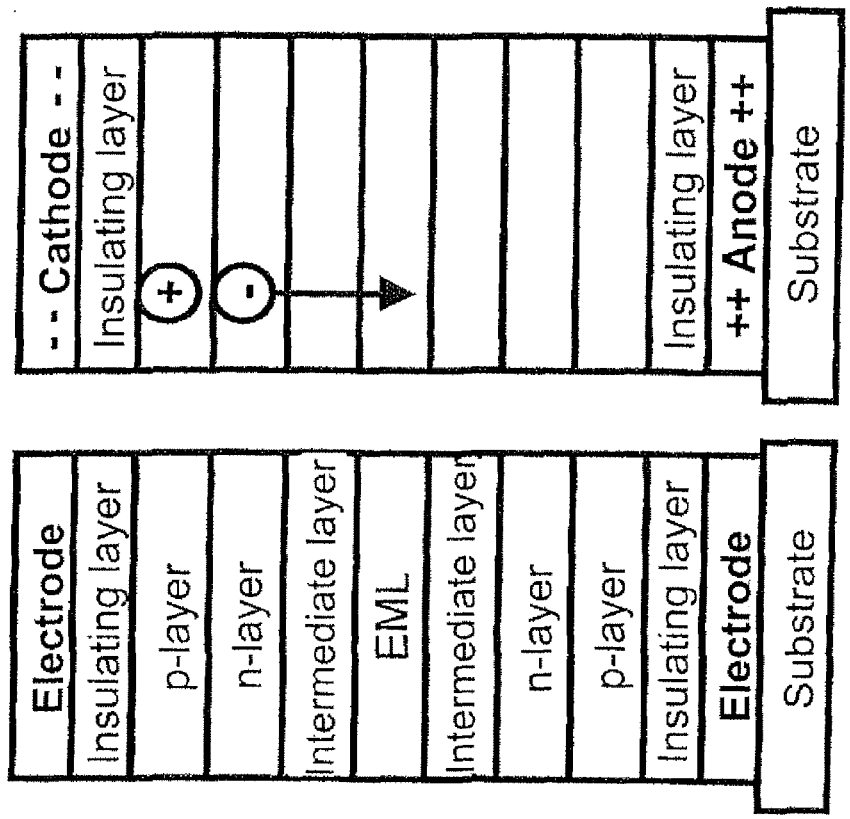
Fig. 6B
Fig. 6A

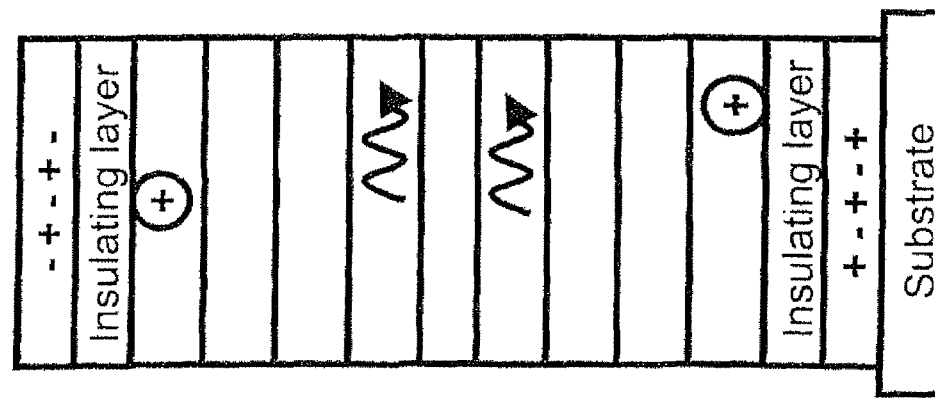
Fig. 7D
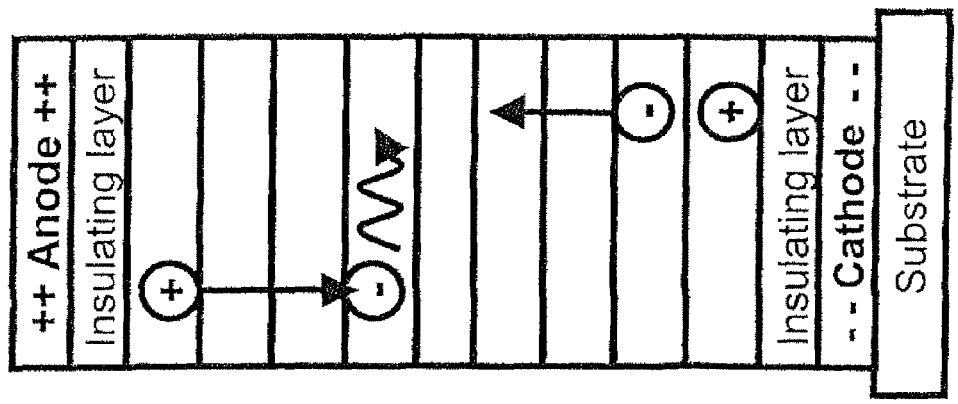
Fig. 7C
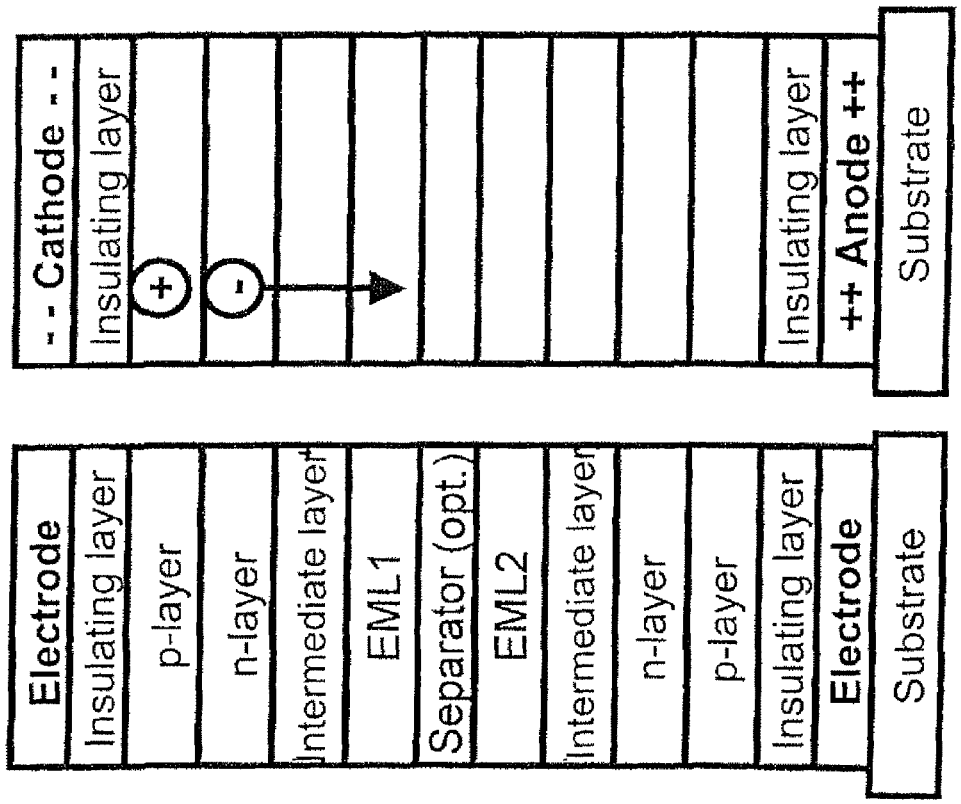
Fig. 7B
Fig. 7A

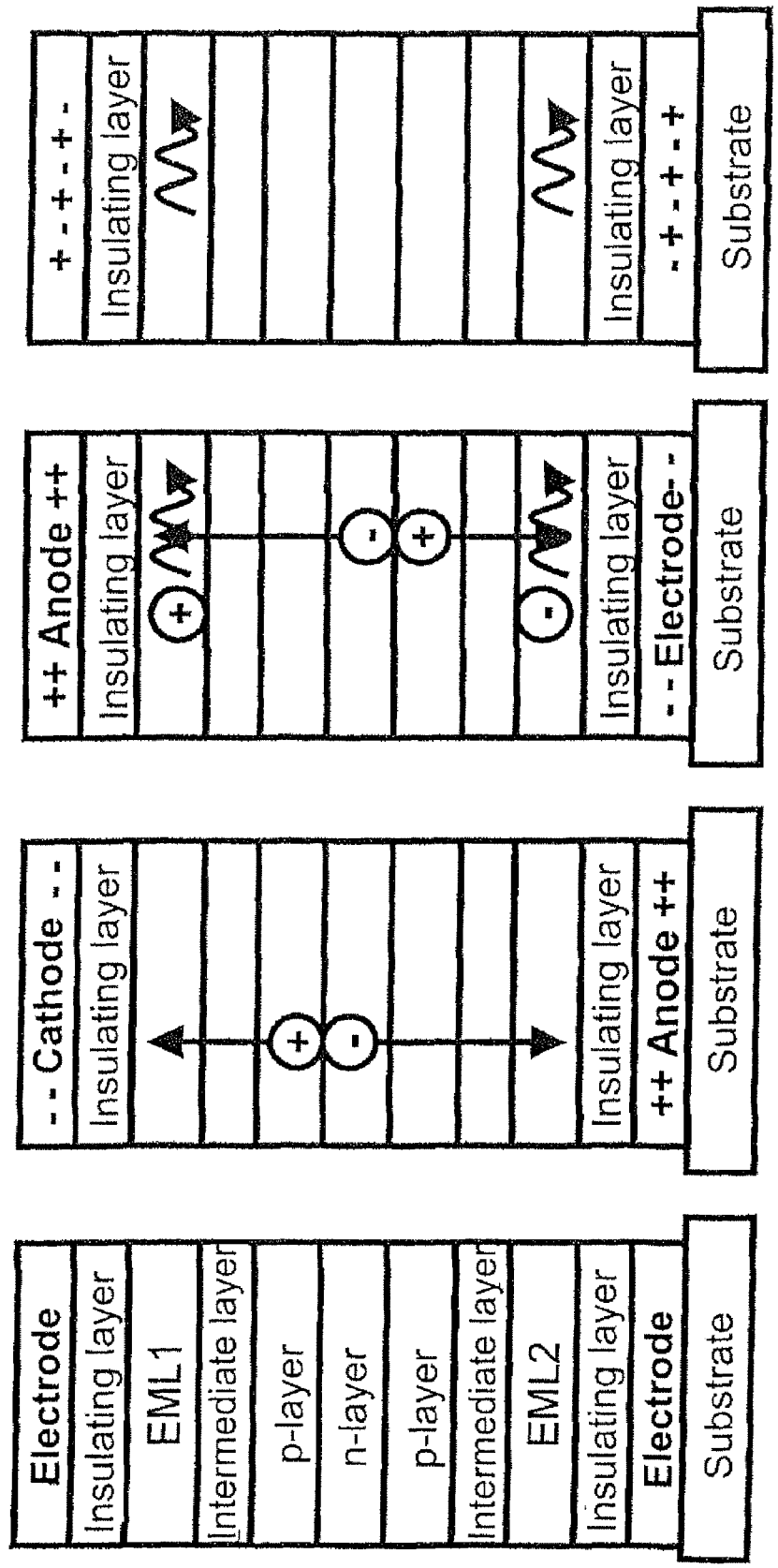

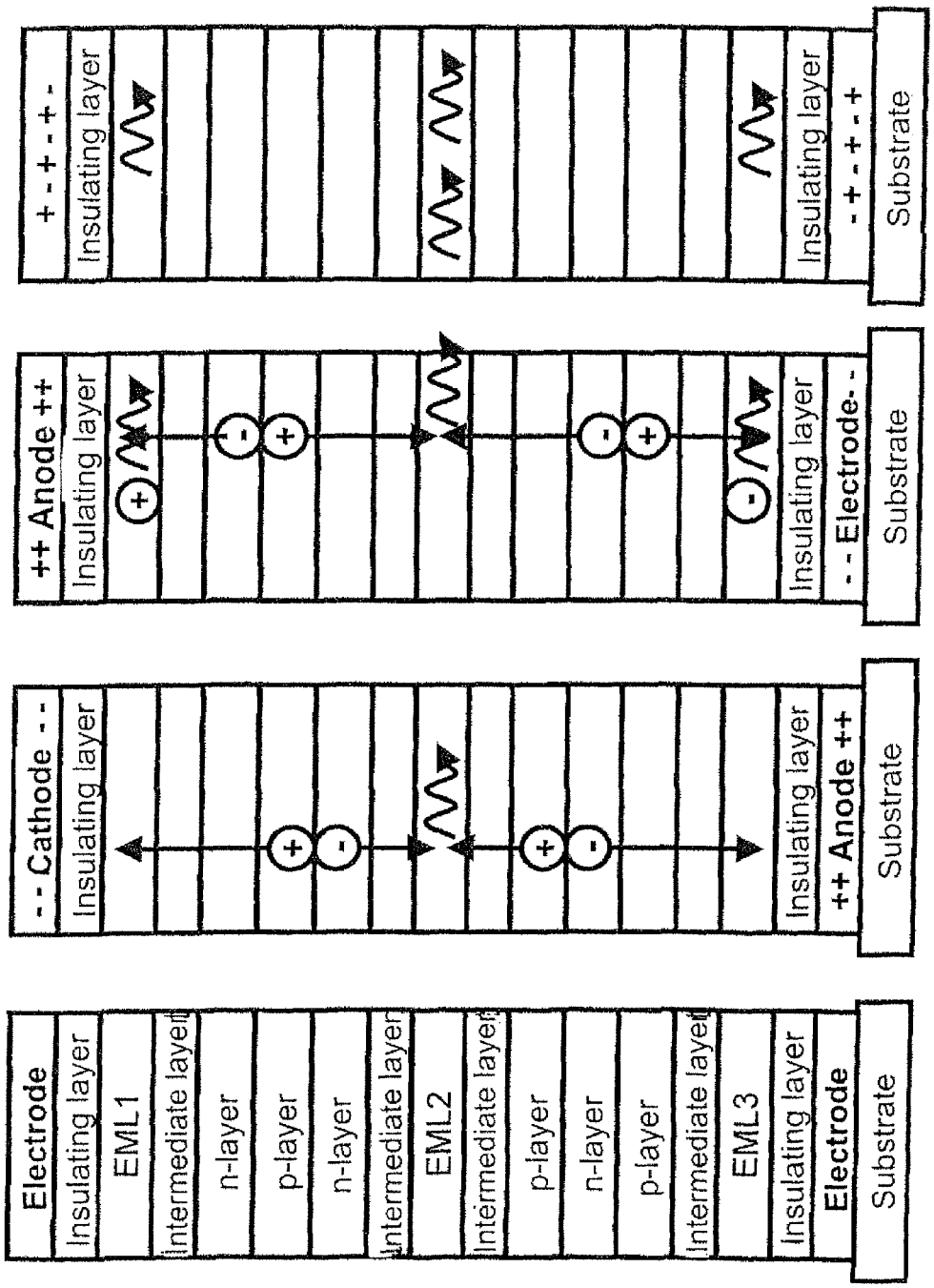

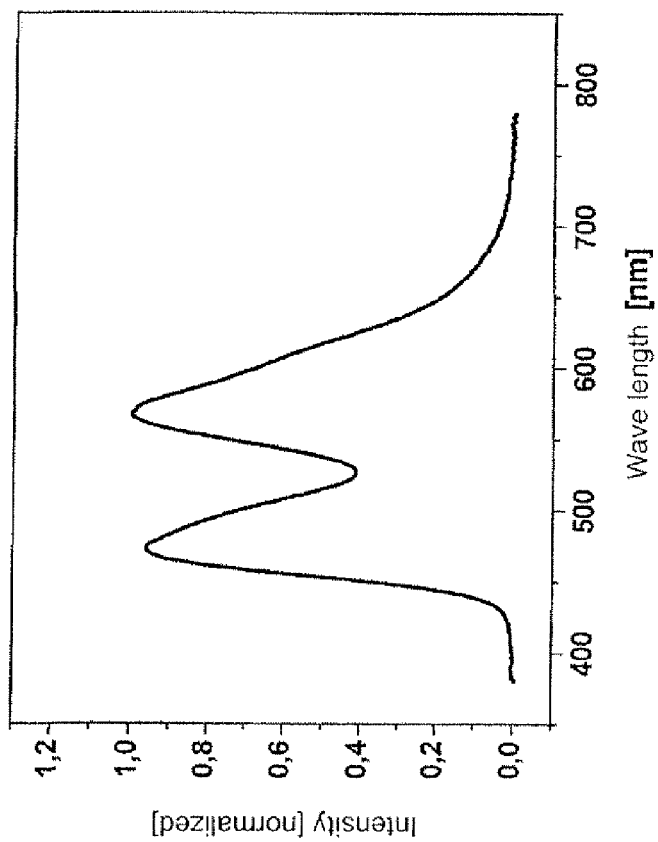
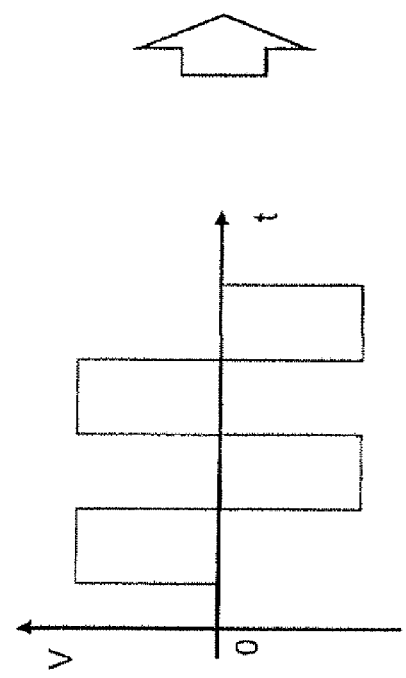
Fig. 12

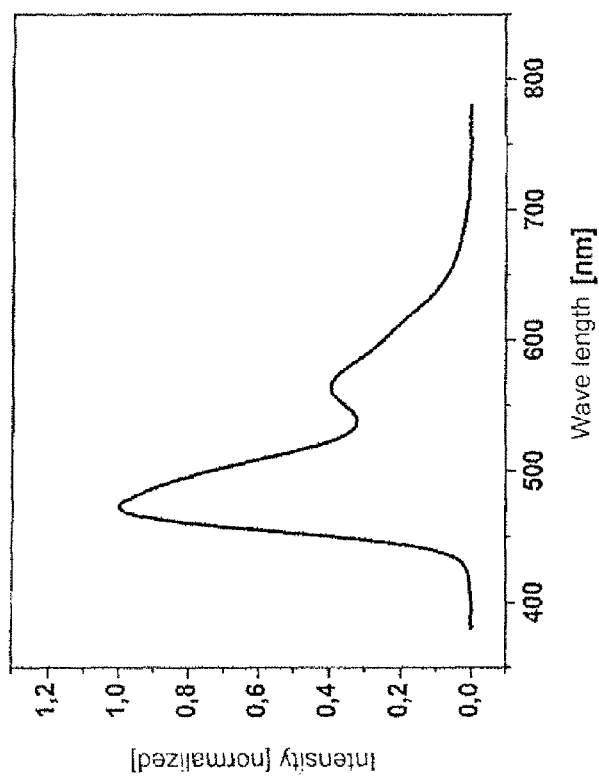
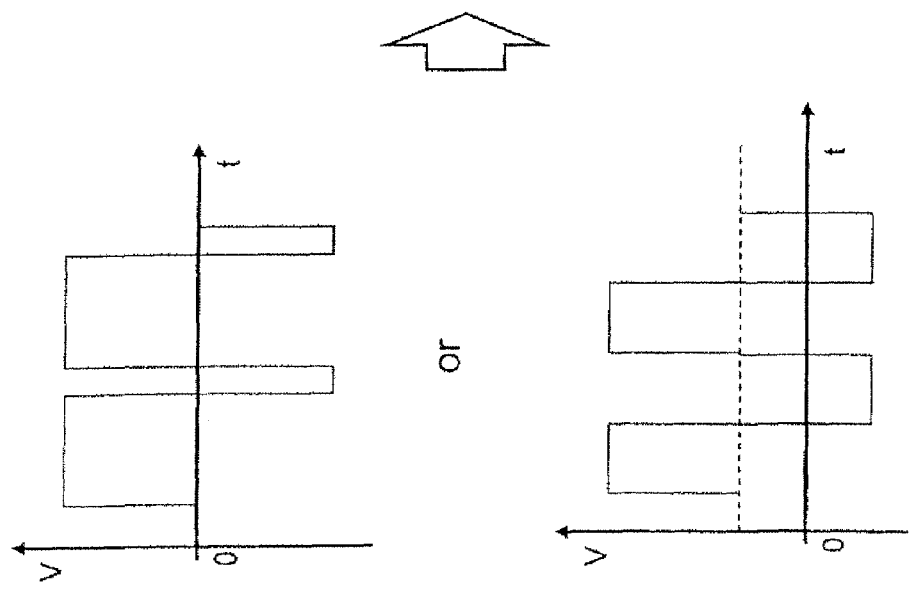
Fig. 13

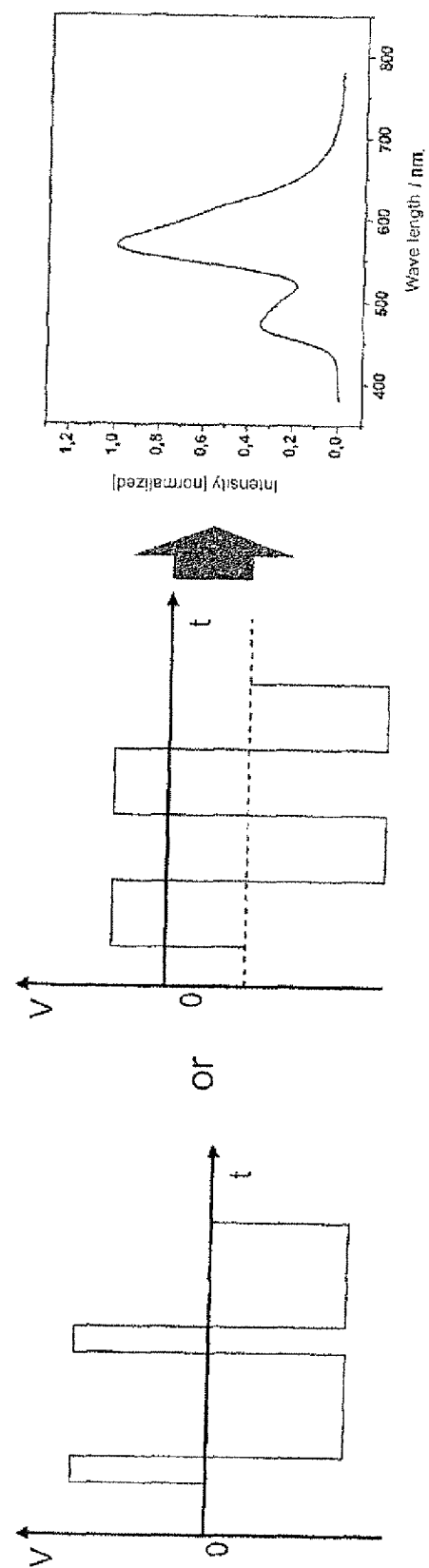

ORGANIC ELECTROLUMINESCENT COMPONENT

CROSS-REFERENCE TO RELATED APPLICATION

This is a submission pursuant to 35 U.S.C. 1.54(d)(4) to enter the national stage under 35 U.S.C. 371 for PCT/EP2008/008683 filed Oct. 14, 2008. Priority is claimed under 35 U.S.C. 119(a) and 35 U.S.C. 365(b) to European Patent Application Number 07020153.8 filed Oct. 15, 2007. The subject matters of PCT/EP2008/008683 and European Patent Application Number 07020153.8 are hereby expressly incorporated herein by reference in their entirety.

The invention relates to an organic, electronic luminescent component, in particular an organic, light-emitting diode.

BACKGROUND OF THE INVENTION

A basic structure for an organic light-emitting diode (OLED) was mentioned by Tang et al. (Appl. Phys. Lett. 51, pages 913 ff., 1987). Current structures for organic light-emitting diodes are mainly always based on the same principle. A stack of layers is formed on a substrate, where an arrangement of layers, usually exhibiting a total thickness of about 100 nm, is formed between an electrode and a counter electrode with organic layers. An anode and a cathode, which can be used to operate the organic light-emitting diode subjected to electrical voltage and through which the component emits light, are formed with the electrode and the counter electrode. A so-called hole transportation layer, made from an organic material, is usually arranged near to the anode in the arrangement of layers. A so-called electron transportation layer, produced from an organic material, is arranged near to the cathode. The charge carriers, in fact electrons and holes, injected into the arrangement of layers at the application of electrical voltage, are transported to a light-emitting area, also formed as a layer, and recombine there when light is emitted.

DC voltage is usually applied during operation, to make the organic light-emitting component produce light. Components of this type that are operated with DC voltage demonstrate certain limitations. The charge carriers are injected into the arrangement of organic layers, which is formed as an organic film, for example, at the application of electrical voltage at the electrodes, in such organic light-emitting diodes. Special electrode materials are necessary to guarantee a good injection of electrons and hole from the electrodes. A good injection means that only a slight decline in voltage arises in the area of the transition between the electrodes and the arrangement of organic layers. A treatment of electrodes with oxygenated plasma or a UV-ozone treatment can be provided; this usually brings advantages in the case of a basic electrode made of ITO (indium tin oxide).

The electrical field is always formed in the same direction, to create electronic luminescence, in organic light-emitting diodes that are operated with DC voltage. The consequence of this is that a stationary force is exerted on all the charge carriers in the electrical field. The constantly demodulated forces lead to the migration of particles or small parts in the arrangement of layers made from organic material under certain circumstances, particularly if they are charged electrically; this limits the useful life of the component.

Organic light-emitting diodes are so-called surface emitters, with at least one of the electrodes being (semi-)transparent, in order to decouple the light created from organic material in the arrangement of layers. At least the (semi-)transparent electrodes are usually formed as a very thin layer for this reason. These electrodes exhibit a small cross section of the flow of the current, through which losses arise, during the operation of the component. These losses of resistances in the electrode are significant in the case of components with a large surface, such as display screens or flat lighting units.

Stacked architectures, where a plurality of organic light-emitting diodes are stacked over each other and connected by electricity, are known as a type of construction of organic light-emitting components for DC voltage operation in addition (EP 1 804 308, EP 1 804 309). The stacked architecture has at least two advantages over individual organic light-emitting diodes. Firstly, the stacking of a plurality of organic light-emitting diodes means a corresponding multiplication of the quantity of light. Apart from this, operating stability can be increased, if the stacked organic light-emitting diodes are operated with a lower operational voltage, during which the light quantity of an individual diode is always still achievable.

The individual units are usually connected by means of different inorganic materials, which serve as a charge carrier generation layer, in stacked architectures of organic light-emitting diodes operated with DC voltage (compare Canzler et al., Proc. of SPIE, Vol. 6333, pages 11 ff., 2006; Gu et al., J. Appl. Phys. 86, pp. 4076 ff., 1999; Matsumoto et al., SID 03 Digest, pp. 979 ff, 2003; Kanno et al., Adv. Mat. 18, pp. 339 ff., 2006; Sun et al., Appl. Phys. Lett. 87, pp. 093504 ff., 2005). Stacked architectures in which a pn-transition (or pn-layer transition) is arranged between two organic light-emitting diodes stacked over each other, where an n-doped layer is formed using an alkali metal and a p-doped layer is formed using $FeCl3$, have been suggested apart from this (Liao et al., Appl. Phys. Lett. 84, pages 167 ff., 2004). Furthermore, molecular doping has been suggested for stacked components for operation with DC voltage (Canzler et al., Proc. of SPIE Vol. 6333, pp. 11 ff., 2006). The combined deposit of a matrix material and an allocated doping material to develop the doped layer, where a charge transfer, through which a doped layer with improved electricity conductivity arises for the charge carrier, takes place during the creation of the layer between the matrix material and the doping material, is characteristic of the creation of p or n-doped organic layers by means of molecular doping.

Organic light-emitting components, particularly organic light-emitting diodes that are operated with AC voltage applied to electrodes, are known in addition. The component elements provided for operation by AC voltage are based on a fundamentally different structure; different demands and requirements of the constructive assembly arise for this reason. The arrangement of layers is made of organic material arranged between the two electrodes and insulated from them, in the case of organic light-emitting components operated with AC voltage, in contrast to organic light-emitting components operated with DC current. An injection of charge carriers, from the electrodes to the arrangement of layers, should not and cannot take place. On the contrary, the charge carriers are created in the arrangement of layers itself, if electrical AC voltage is applied at the electrodes.

An organic, electronic luminescent component for operation with AC voltage is known from the US 2004/0027059 A1 document. A bipolar charge carrier generation layer, in which the charge carriers, namely electrons and holes, are created at the application of AC voltage, is arranged between each of the neighbouring light-emitting layers formed between the electrodes in the arrangement of layers, in the case of the known component. Then, the charge carriers created enter into the neighbouring light-emitting layers from the bipolar charge carrier generation layer, in order to recombine during the output of light. A similar structure is known in Tsutsui et al.

(Appl. Phys. Lett. 85, Nr. 12, pp. 2382 ff, 2004). The bipolar charge carrier generation layer can be structured as one or a plurality of layers.

From the US 2005/0156197 A1 document, organic semiconductor elements for DC voltage operation are known, with a charge carrier generation layer with a pn layer transition being formed between a layer made of an organic acceptor material and one made of organic donor material.

In addition, a bipolar charge carrier generation layer is known from Terai et al. ('Electric-field-assisted bipolar charge generation from internal charge separation zone composed of doped organic bilayer', Appl. Phys. Lett., Vol. 90, No. 8, 21. February 2007, pp. 83502-83502).

SUMMARY OF THE INVENTION

It is the object of the invention to provide an organic, electronic luminescent component, with an extended design freedom is enabled with regard to the structural design of the layers.

The object is solved with regard to the invention by an organic, electronic luminescent component in accordance with the independent Claim 1. The subject of the dependent sub-claims is advantageous developments of the invention.

The invention comprises the idea of an organic, electronic luminescent component with an arrangement of organic layers between an electrode and a counter electrode, wherein said arrangement of organic layers is electrically insulated from the electrode and the counter electrode, and comprises a light-emitting layer and a charge carrier generation region allocated to the light-emitting layer, wherein the charge carrier generation region is configured to provide positive and negative charge carriers at an application of an electrical AC voltage to the electrode and the counter electrode, and wherein a pn-layer transition is formed in the charge carrier generation region by means of a p-doped organic layer and a n-doped organic layer arranged next to the p-doped organic layer. A flexible and useful alternative is given, to provide the charge carrier generation layer for operation by AC voltage at different points in the arrangement of organic layers in an organic electronic luminescent component, is provided with the aid of providing a pn-layer transition in the charge carrier generation layer, by which charge carriers, namely electrons and holes, can be provided at any points in the arrangement of layers at the application of AC current, in order to then have them recombine into one or a plurality of light-emitting layers for the generation of light.

An optical cavity formed between the electrode and the counter electrode can be set for the optimised light outcoupling, by means of the provided electrical doping, in the case of the proposed electronic luminescent component. This is based on the fact that the thickness of the layer of the n-doped organic layer and the p-doped organic layer can be set variably, without increasing the operational voltage and frequency of the component greatly. This is not possible at all or only possible with strict limits, with electrically undoped layers as they are formed in the current status of technology, because an increase in the thickness of the layer increases the electrical resistance of the component and leads to an increase in the operating voltage needed in this case.

A preferred further development of the invention provides that the arrangement of layers is electrically insulated from the electrode and the counter electrode by means of a particular insulating layer. Here, the particular insulating layer can be formed directly on the allocated electrode in one development, namely on the area of the electrode turned towards the arrangement of layers.

In a convenient variant of the invention it can be provided that the charge carrier generation layer is formed in contact with one of the insulating layers.

An advantageous embodiment of the invention provides that the light-emitting layer is formed in contact with one of the insulating layers.

A further preferred development of the invention provides that an additional pn-layer transition is formed in the charge carrier generation layer, by:
  forming the charge carrier generation layer as an organic npn-layer structure, with an additional n-doped organic layer being arranged next to the p-doped organic layer, or
  forming the charge carrier generation layer as an organic pnp-layer structure, with an additional p-doped organic layer being arranged next to the n-doped organic layer.

In an advantageous development of the invention it can be provided that an intermediate layer with bipolar charge carrier transportation properties is arranged between the light-emitting layer and the charge carrier generation region. Here, the development of bipolar charge carrier transportation layers means that both the positive electrical charge carriers (holes) and the negative electrical charge carriers (electrons) can be transported within and through the intermediate layer, in order to lead them out of the charge carrier generation region to the light-emitting layer.

A further development of the invention can provide that the light-emitting layer is formed in contact with the charge carrier generation region.

A preferred further development of the invention provides that an intermediate layer with bipolar transportation features for the positive and negative charge carriers is arranged between the light-emitting layer and the charge carrier generation region. The transportation of the positive and the negative electric charge carriers to the light-emitting layer is enabled by means of the bipolar transportation features, whereas a transportation of charge carriers out of the light-emitting layer is blocked. The energy levels involved in the charge carrier transportation for electrons and holes of the intermediate layer are adjusted to the effective energy levels of the light-emitting layer involved in the charge carrier transportation for this, so that an energy level preventing a back transfer of a charge carrier from the light-emitting layer to the intermediate layer is present in normal operation of the component, both for holes and for electrons. The energy level is functionally at least as high as the thermal energy of the charge carrier at operating temperature. For example, kT is about 25 meV at ambient temperature (23° C.).

In a convenient variant of the invention it can be provided that the light-emitting layer is formed with a plurality of light-emitting partial layers.

An advantageous variant of the invention provides at least one additional light-emitting layer. This at least one additional light-emitting layer can be formed in the same way as the original light-emitting layer or differently. This applies both to the structural assembly of the at least one additional light-emitting layer and to the design of the areas neighbouring it in the arrangement of layers. The at least one additional light-emitting layer can receive the charge carriers recombining in it to generate light from the same charge carrier generation region from which the charge carriers reach the light-emitting layer, or from a different charge carrier generation region.

A further preferred development of the invention provides that the light-emitting layer and the at least one additional light-emitting layer are formed next to each other, separated by a bipolar separating layer that is configured to block a transportation of the positive and negative electrical charge carriers through the bipolar separating layer. A trespass of electrical charge carriers between the light-emitting layer and the at least one additional light-emitting layer is prevented in this way. Alternatively to this, the light-emitting layer and the at least one additional light-emitting layer can be formed in contact with each other.

In an advantageous development of the invention, it can be provided that the charge carrier generation region is arranged between the light emitting layer and the at least one additional light-emitting layer.

A further development of the invention can provide that the light-emitting layer contains an emitter system and the at least one additional light-emitting layer contains a further emitter system, wherein the emitter system and the further emitter system are configured to emit light in a different colour.

A preferred further development of the invention provides at least one additional charge carrier generation region. The at least one additional charge carrier generation region can be formed in the same way as the charge carrier generation region or differently. This applies both to the structural or material implementation and to the design of the neighbouring areas of the at least one additional charge carrier generation region in the arrangement of layers. The charge carrier generation region and the at least one additional charge carrier generation region exhibit a reverse layer structure, viewed from the electrode to the counter electrode, in one version, so that a pn-layer transition and an np-layer transition are formed in the line of sight.

In a convenient variant of the invention, it can be provided that the light-emitting layer is arranged between the charge carrier generation region and the at least one additional charge carrier generation region.

An advantageous embodiment of the invention provides that a plurality of light-emitting layers and a plurality of charge carrier generation regions are arranged alternately in the arrangement of layers.

A preferred further development of the invention provides that the arrangement of layers exhibits at least one charge carrier blocking layer that is configured to block the transportation of at least the positive electrical charge carriers or at least the negative electrical charge carriers.

A convenient variant of the invention provides that the arrangement of layers is formed between the electrode and the counter electrode with a non-symmetrical arrangement of the layers. A non-symmetrical arrangement of layers is then formed between the electrode and the counter electrode, if a different layer sequence arises at the same point of view, when the arrangement of organic layers is reversed, from the electrode to the counter electrode, for example. The balance between the positive and negative electrical charge carriers can be changed for an asymmetrical version by means of the application of non-symmetrical AC voltage. Asymmetrical AC voltage is characterised by the fact that the lengths of time for positive and negative signal sections are different and/or asymmetrical amplitudes are present for both signal sections, i.e. AC voltage is combined with DC voltage. As a result, the power efficiency of the electronic luminescent component can be optimised by means of an externally controllable parameter.

The balance of light emission sections, that are capable of being established in addition, to determine spectral sections by means of measurements or intensity measurements triggered dependent on wave length for example, can be set to the different light-emitting layers, for non-symmetric versions with a plurality of light-emitting layers. This is advantageous, for example, for the creation of white light by means of a blue light-emitting layer and a yellow light-emitting layer, because a point of white light can be controlled by means of an external parameter, namely the superimposed DC current, in this way.

BRIEF DESCRIPTION OF THE DRAWINGS

In the following, the invention is explained in closer detail with the help of exemplified embodiments referring to the figures of a drawing, showing.

DETAILED DESCRIPTION

Figure 1:
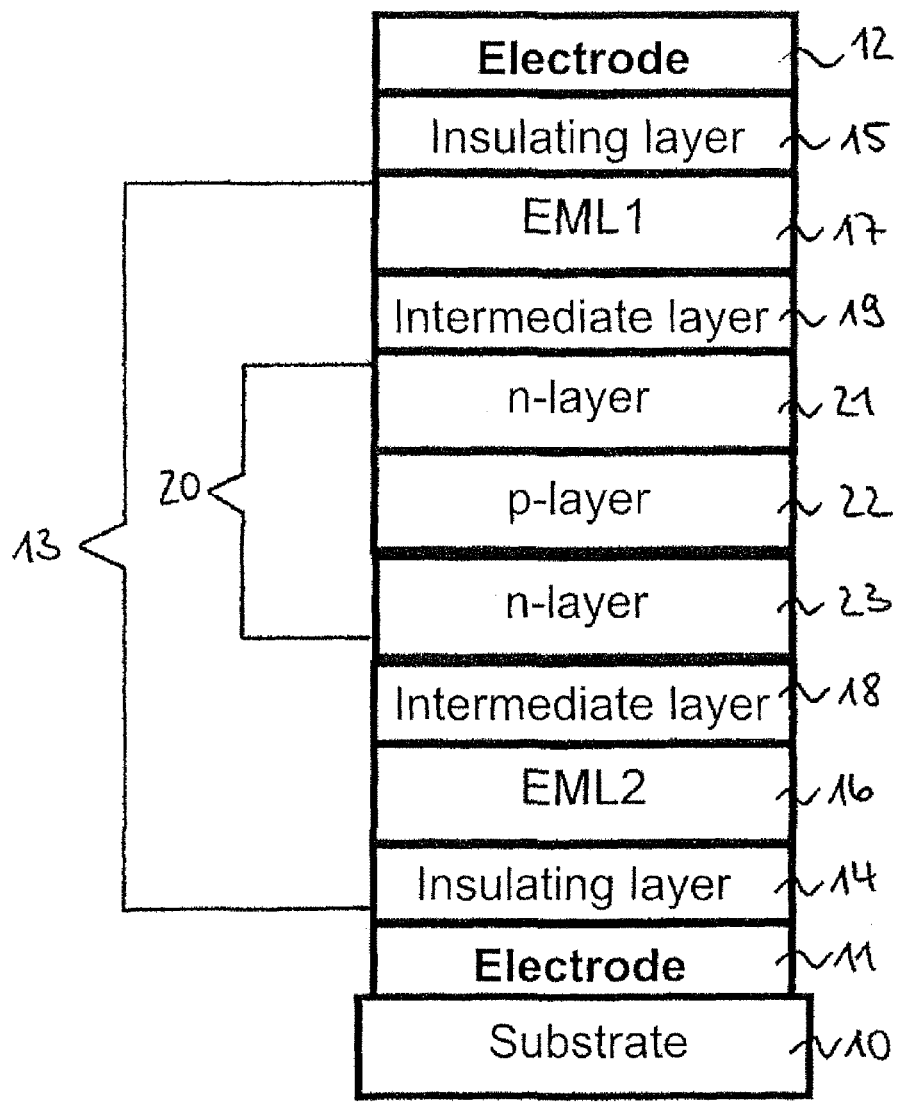
FIG. 1 A schematic illustration of an organic, electronic luminescent component in a symmetric version for operation with AC voltage, FIG. 2 A graphic illustration of the luminance depending on the frequency of applied AC voltage for the organic, electronic luminescent component in accordance with FIG. 1, FIGS. 3A to 3D A schematic illustration of an organic, electronic luminescent component for operation with AC voltage, with one light-emitting layer being formed between two charge carrier generation regions, FIGS. 4A to 4D A schematic illustration of an organic, electronic luminescent component for operation with AC voltage, with, the light-emitting layer being formed of two layers, in contrast to the component in accordance with FIGS. 3A to 3D, FIGS. 5A to 5D A schematic illustration of an organic electronic luminescent component for operation with AC voltage with a plurality of light-emitting layers and a plurality of charge carrier generation regions, FIGS. 6A to 6D A schematic illustration of an organic, electronic luminescent component in a symmetric version for operation with AC voltage, with the light-emitting layer being enclosed by intermediate layers, FIGS. 7A to 7D A schematic illustration of an organic, electronic luminescent component for operation with AC voltage, with two light-emitting layers being separated by means of a bipolar separating layer, FIGS. 8A to 8D A schematic illustration of an organic, electronic luminescent component for operation with AC voltage, with a charge carrier generation region being arranged between two light-emitting layers, FIGS. 9A to 9D A schematic illustration of an organic, electronic luminescent component for operation with AC voltage, with one charge carrier generation region being provided with an npn-layer structure and an additional charge carrier generation region is provided with a pnp-layer structure, FIG. 10 A generalised schematic illustration of an organic, electronic luminescent component for operation with AC voltage in a non-symmetric variant, FIG. 11 A graphic illustration of a luminescence spectrum for a blue and a yellow emitter system, FIG. 12 Graphic illustrations for symmetrical AC voltage and an electronic luminescence spectrum for the component from FIG. 10, FIG. 13 Graphic illustrations for non-symmetrical AC voltage and an electronic luminescence spectrum arising from it for the component in accordance with FIG. 10, and FIG. 14 Graphic illustrations for non-symmetrical AC voltage and an electronic luminescence spectrum arising from it for the component in accordance with FIG. 10.

FIG. 1 shows a schematic illustration of an organic electronic luminescent component for operation with AC voltage, with a plurality of layers being introduced on a substrate 10, namely an electrode 11 implemented as a basic electrode, a counter electrode 12 implemented as a covering electrode, an arrangement of layers 13 of one or a plurality of organic materials, which is insulated electrically from the two electrodes 11, 12 by an insulating layer 14 and an additional insulating layer 15. The arrangement of layers 13 is an arrangement of organic layers, containing a light-emitting layer (EML2) 16 and an additional light-emitting layer (EML1) 17. Positive electrical charge carriers (holes) and negative electrical charge carriers (electrons) recombine within the light-emitting layers 16, 17 during the operation of the component, outputting light.

An intermediate layer 18 and an additional intermediate layer 19 are formed next to the light-emitting layers 16, 17. The intermediate layers 18, 19 allow the transportation of the electrical charge carriers to the light-emitting layers 16, 17 and block the opposing transportation of charge carriers from the light-emitting layers 16, 17. A charge carrier generation region 20, with an n-doped organic layer (n-layer) 21, a p-doped organic layer (p-layer) 22 and an additional n-doped organic layer (n-layer) 23, is embedded in the intermediate layers 18, 19. The doped layers 21, 22, 23 are each produced from a system with a matrix material and a stored doping material, as a result of which molecular electrical doping is developed. The materials are deposited by means of combined vaporization, so that the molecules of the doping material are spatially distributed or embedded in the matrix material. A charge transfer takes place between the respective matrix material and the associated doping material during the production of the doped layers 21, 22, 23, so that the respectively required molecular doping arises. This will result in improved electrical conductivity for the required charge carriers. The charge transfer rests on an oxidation reaction between the matrix material and the doping material. The result is an increase in the number of free charge carriers in the doped layer in comparison to a layer consisting only of matrix material. The type and production of doped layers of this sort are known otherwise as such in different versions and are not further explained for this reason. The statements made about doping apply correspondingly to the sample developments in FIGS. 3 to 9 below.

The abbreviations specified as follows are used in the following versions: ITO=Indium tin oxide; Al=aluminium; CBP=4,4'-bis(carbazole-9-yl)biphenyl; BAlq=to(2-methyl-8-quinolinato)-4-(phenylphenolato)aluminium-(III); MeOTPD=N,N,N'N-tetrakis(4-methoxyphenyl)benzidine; F4-TCNQ=7,7,8,8-tetracyano-2,3,5,6-tetrafluoroquinodimethane; Cs=caesium; BPhen=4,7-diphenyl-1,10-phenanthroline; rubren=5,6,11,12-tetraphenylnaphthacene; Alq3=tris(8-hydroxyquinoline)aluminium; and DCJTB=4-(dicyanomethylene)-2-tert-butyl-6-(1,1,7,7-tetramethyljulolidin-4-yl-vinyl)-4H-pyran.

The organic electronic luminescent component in FIG. 1 was produce with the following layer structure in one variant: Basic electrode (ITO, layer thickness=90 nm), insulating layer (CBP, 40 nm), light-emitting layer (rubren with Alq3, (38 w %) and DCJTB (2 w %, 20 nm), intermediate layer (BAlq2, 10 nm), additional n-doped, organic layer (BPhen with Cs, 10 nm) p-doped organic layer (MeOTPD with F4-TCNQ, 20 nm), additional n-doped organic layer (BPhen with Cs, 10 nm), additional intermediate layer (BAlq2, 10 nm), additional light-emitting layer (rubren with Alq3 (38 w %) and DCJTB (2 w %, 20 nm)), additional insulating layer (CBP, 40 nm) and covering electrode (Al, 100 nm).

Figure 2:
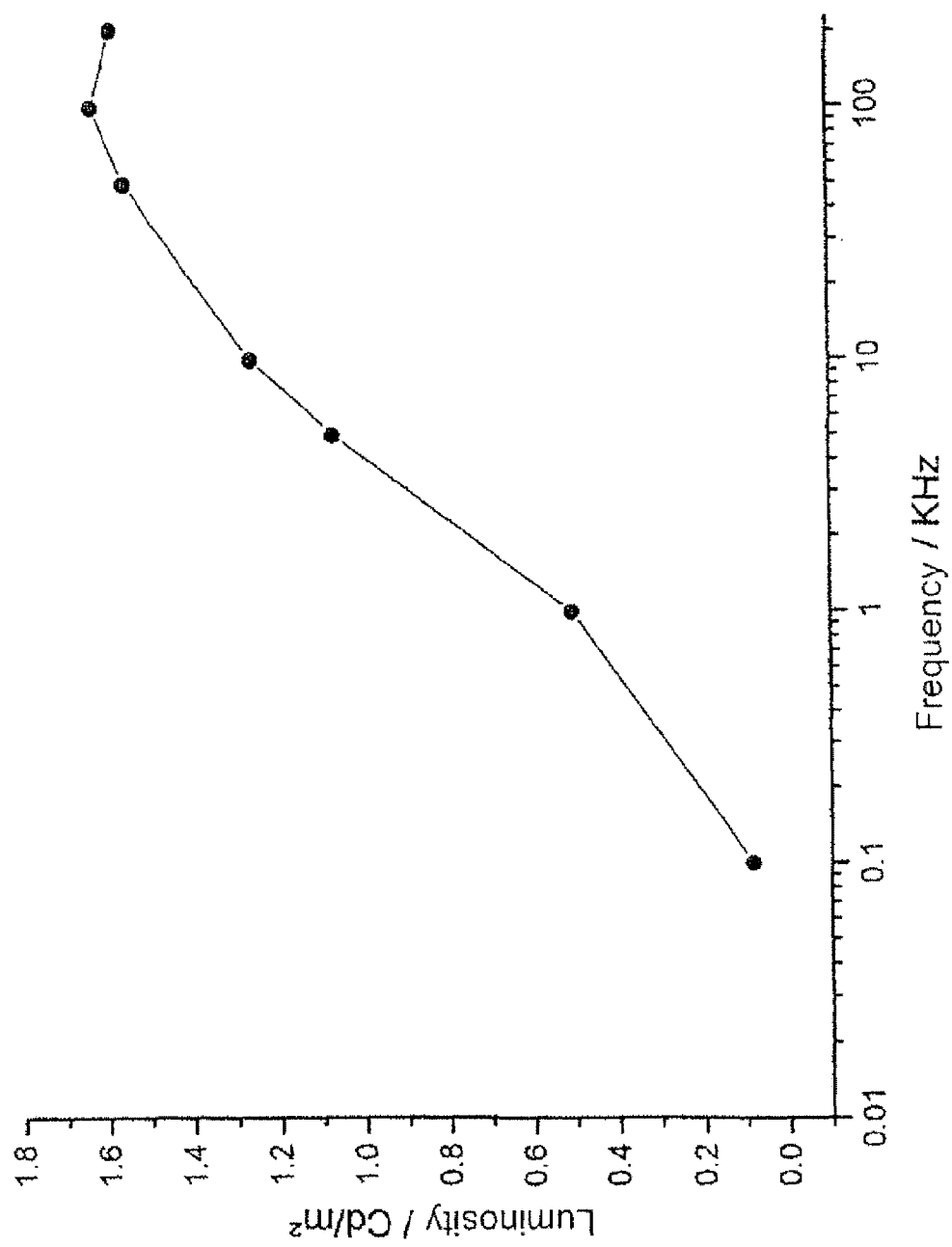

FIG. 2 shows a graphic illustration of the measured values for the luminosity of the previously described organic, electronic luminescent component, depending on the frequency of the applied AC voltage. The AC voltage has amplitude of ±20V. In contrast, the component shows no electronic luminescence for an applied AC voltage from +20V or −20V, AC voltage with only positive voltage values, between 0 and +20V, for example, or AC voltage with only negative voltage values, between 0 and +20V, for example.

FIGS. 3A to 3D show a schematic illustration of an organic, electronic luminescent component for operation with AC voltage with a light-emitting layer being formed between two charge carrier generation regions.

In accordance with FIG. 3A, an electrode 31 carried out as a basic electrode and an electrode 32 carried out as a covering electrode are formed on a substrate 30. An arrangement of organic layers 33, which is electrically insulated from the electrodes 31, 32 with the aid of insulating layers 34, 35, is produced between electrodes 31, 32. The arrangement of organic layers 33 includes two charge carrier generation regions 36, 37, each of which exhibits an organic p-doped and an organic n-doped layer (p or n-layer), between which a light-emitting layer (EML) 38 is arranged, to develop a pn-layer transition.

FIGS. 3B to 3D serve the schematic explanation of the operation of the organic, electronic luminescent component from FIG. 3A, which relies on the Zener effect. The alternating development of an anode and a cathode by means of the two electrodes 31, 32 (compare FIGS. 3B and 3C) will arise at the application of electrical AC voltage. Charge carriers in the form of holes and electrons, which will then migrate into the light-emitting layer 38 and recombine, outputting light, will be created in the charge carrier generation regions 36, 37, according to the formation of the cathode or anode.

FIGS. 4A to 4D show a schematic illustration of an organic, electronic luminescent component for operation with AC voltage, with the light-emitting layer being formed in two layers, in contrast to the component in accordance with FIG. 3A to 3D. FIGS. 4B to 4D again show the operation of the organic, electronic luminescent component from FIG. 4A schematically at the application of electrical AC voltage. The ratio between the respective light emission sections, which can, for example, be determined by means of a given light intensity, can be set for the light-emitting layers by means of non-symmetric AC voltage in the case of this version. The overall emission spectrum of the electronic luminescent component can be set variably in this way, in the case of the execution of the light-emitting layers from different materials, which can lead to different emission spectra. A different development will be achieved in particular by the fact that different emitter materials are laid in a matrix material of the same kind, as desired. A version of this type, including the possibilities for operation associated with it, can also be used in connection with others of the explained variants, in particular to create white light variably.

FIGS. 5A to 5D show a schematic illustration of an organic, electronic luminescent component for operation with AC voltage with a plurality of light-emitting layers and a plurality of charge carrier generation regions. FIGS. 5B to 5D show the operation of the organic, electronic luminescent component from FIG. 5A schematically at the application of electrical AC voltage.

FIGS. 6A to 6D show a schematic illustration of an organic, electronic luminescent component for operation with AC voltage, where the light-emitting layer is enclosed by the intermediate layers 60, 61. FIGS. 6B to 6D show the operation of the organic, electronic luminescent component from FIG. 6A schematically at the application of electrical AC voltage.

FIGS. 7A to 7D show a schematic illustration of an organic, electronic luminescent component for operation with AC voltage, with two light-emitting layers being separated by means of a bipolar separating layer. The separating layer blocks an exchange of electrical charge carriers between the two light-emitting layers. The separating layer is optional. The ratio between light emission sections for the two light-emitting layers can be set by means of asymmetric AC voltage in an alternative version without a separating layer (not represented). The overall emission spectrum of the component can be set variably in this way, in the case of a version with two light-emitting layers with different emission spectra. FIGS. 7B to 7D show the operation of the organic electronic luminescent component from FIG. 7A schematically at the application of electrical AC voltage.

FIGS. 8A to 8D show a schematic illustration of an organic, electronic luminescent component for operation with AC voltage, with a charge carrier generation region being arranged between two light-emitting layers. FIGS. 8B to 8D show the operation of the organic, electronic luminescent component from FIG. 8A schematically at the application of electrical AC voltage.

FIGS. 9A to 9D show a schematic illustration of an organic, electronic luminescent component for operation with AC voltage, with one charge carrier generation region being provided with an npn-layer structure and an additional charge carrier generation region is provided with a pnp-layer structure. FIGS. 9B to 9D show the operation of the organic, electronic luminescent component from FIG. 9A schematically at the application of electrical AC voltage.

An embodiment of an organic electronic luminescent component in a non-symmetric structure will be described in greater detail in the following, referring to FIGS. 10 to 14.

Figure 11:
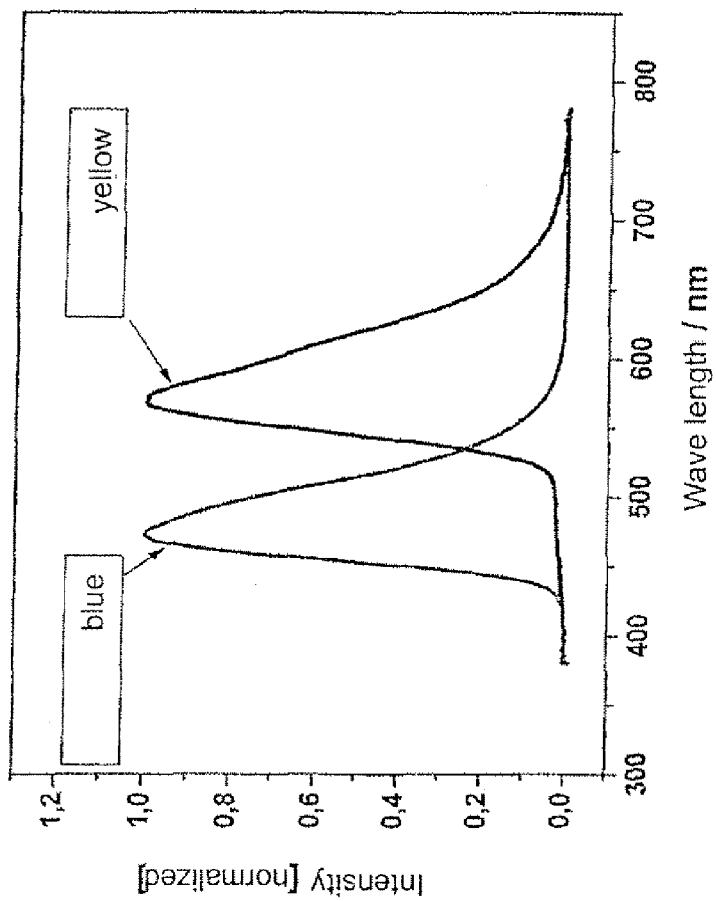
Figure 10:
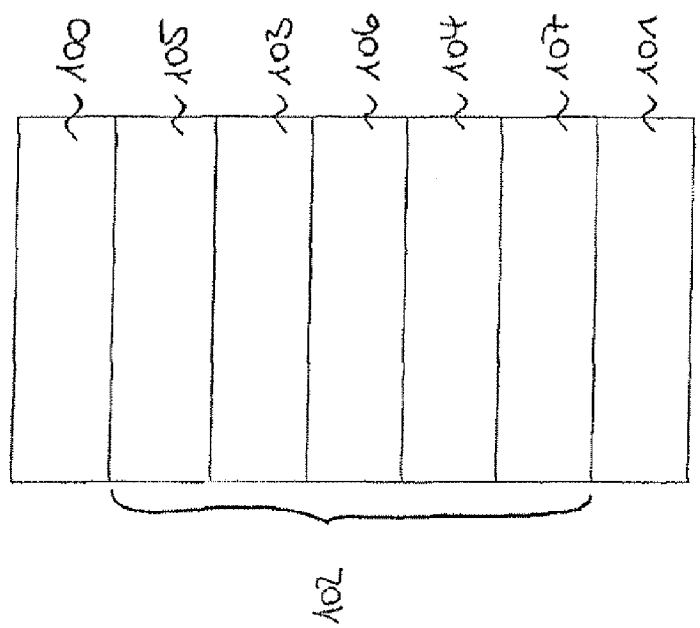

FIG. 10 shows a layer structure for an organic, electronic luminescent component schematically in a non-symmetric construction. A stack of organic layers 102 is arranged between electrodes 100, 101. The stack of organic layers 102 includes an initial light-emitting layer 103, which is provided with an emitter material that emits in the blue area of the light spectrum. An additional light-emitting layer 104 is provided with an emitter material that emits in the yellow area of the light spectrum. The spectra for both emitter materials are shown in FIG. 11.

In addition, the stack of organic layers 102 includes a plurality of organic layers 105, 106, 107. These layers can be executed according to the versions of layers of the same type listed above.

FIG. 12 shows graphic illustrations for symmetrical AC voltage and an electronic luminescence spectrum in the case of the component from FIG. 10. Symmetric voltage pulses will be output.

FIG. 13 shows graphic illustrations for non-symmetrical AC voltage and an electronic luminescence spectrum arising from it for the component in accordance with FIG. 10.

FIG. 14 shows graphic illustrations for non-symmetrical AC voltage and an electronic luminescence spectrum arising from it for the component in accordance with FIG. 10. Non-symmetric AC voltage pulses, which lead to the electronic luminescence spectrum shown, are present on the component in the case of the operational AC voltage in FIGS. 12 and 13.

The versions of arrangements of layers explained in the above sample developments can be combined with each other in any way, particularly in relation to the charge carrier generation regions and the light-emitting layers, even if this is not represented in the Figures for individual possibilities of combination.

The characteristics of the invention revealed in the above Description, the Claims and the Drawings can be significant to the realization of the invention in its different embodiments, both individually and in any combination.

The invention claimed is:

1. An organic electronic luminescent component comprising an arrangement of organic layers arranged between an electrode and a counter electrode, wherein said arrangement of organic layers is electrically insulated from the electrode and the counter electrode, and comprises a light-emitting layer and a charge carrier generation region allocated to the light-emitting layer, wherein the charge carrier generation region provides positive and negative charge carriers upon application of an electrical AC voltage to the electrode and the counter electrode, wherein the charge carrier generation region comprises a pn-layer transition comprising a p-doped organic layer and a n-doped organic layer arranged next to the p-doped organic layer, and wherein the arrangement of organic layers has at least one charge carrier blocking layer that blocks the transportation of at least the positive electrical charge carriers or of at least the negative electrical charge carriers.

2. The organic electronic luminescent component in accordance with claim 1, wherein an intermediate layer with bipolar charge carrier transportation properties is arranged between the light-emitting area and the charge carrier generation region.

3. The organic electronic luminescent component in accordance with claim 1, wherein the light-emitting layer contacts the charge carrier generation region.

4. The electronic luminescent component in accordance with claim 1, wherein an intermediate layer with bipolar charge carrier transportation properties for the positive and the negative electrical charge carriers is arranged between the light-emitting layer and the charge carrier generation region.

5. The organic electronic luminescent component in accordance with claim 1, wherein the light-emitting layer comprises a plurality of light-emitting partial layers.

6. The organic electronic luminescent component in accordance with claim 1, wherein the arrangement of organic layers between the electrode and the counter electrode comprises a non-symmetric arrangement of the layers.

7. A process for operating an electronic luminescent component in accordance with claim 6, wherein a non-symmetric AC voltage is applied at the electrode and the counter electrode.

8. The organic electronic luminescent component in accordance with claim 1, wherein the arrangement of organic layers is electrically insulated from the electrode and the counter electrode by one or more insulating layers.

9. The organic electronic luminescent component in accordance with claim 8, wherein the charge carrier generation region contacts at least one of the one or more insulating layers.

10. The organic electronic luminescent component in accordance with claim 8, wherein the light-emitting layer contacts at least one of the one or more insulating layers.

11. The organic electronic luminescent component in accordance with claim 1, wherein the charge carrier generation region comprises an additional pn-layer transition.

12. The organic electronic luminescent component in accordance with claim 11, wherein the charge carrier generation region comprises an organic npn-layer structure, wherein an additional n-doped organic layer is arranged next to the p-doped organic layer.

13. The organic electronic luminescent component in accordance with claim 11, wherein the charge carrier generation region comprises an organic pnp-layer structure, wherein an additional p-doped organic layer is arranged next to the n-doped organic layer.

14. The organic electronic luminescent component in accordance with claim 1, comprising at least one additional charge carrier generation region.

15. The manic electronic luminescent component in accordance with claim 14, wherein the light-emitting layer is arranged between the charge carrier generation region and the at least one additional charge carrier generation region.

16. The organic electronic luminescent component in accordance with claim 14, wherein a plurality of light-emitting layers and a plurality of charge carrier generation regions are arranged alternately in the arrangement of organic layers.

17. The organic electronic luminescent component in accordance with claim 1, comprising at least one additional light-emitting layer.

18. The organic electronic luminescent component in accordance with claim 17, wherein the light-emitting layer and the at least one additional light-emitting layer are next to each other and separated by a bipolar separating layer that blocks the transportation of the positive and the negative electrical charge carriers through the bipolar separating layer.

19. The organic electronic luminescent component in accordance with claim 17, wherein the charge carrier generation region is arranged between the light-emitting layer and the at least one additional light-emitting layer.

20. The manic electronic luminescent component in accordance with claim 17, wherein the light-emitting layer includes an emitter system and the at least one additional light-emitting layer includes a further emitter system, wherein the emitter system and the further emitter system are configured to emit light of a different colour.

* * * * *

UNITED STATES PATENT AND TRADEMARK OFFICE
CERTIFICATE OF CORRECTION

PATENT NO. : 8,466,453 B2
APPLICATION NO. : 12/738003
DATED : June 18, 2013
INVENTOR(S) : Philipp Wellmann et al.

It is certified that error appears in the above-identified patent and that said Letters Patent is hereby corrected as shown below:

In the Claims

Column 10, line 31, after "The" insert --organic--.

Column 12, line 11, delete "manic" and insert --organic--.

Signed and Sealed this
Thirtieth Day of July, 2013

Teresa Stanek Rea
*Acting Director of the United States Patent and Trademark Office*